(12) United States Patent
Asano et al.

(10) Patent No.: US 6,573,529 B2
(45) Date of Patent: Jun. 3, 2003

(54) SEMICONDUCTOR SWITCHING DEVICE

(75) Inventors: Tetsuro Asano, Ora-gun (JP);
Toshikazu Hirai, Ora-gun (JP); Mikito Sakakibara, Oosato-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/152,880

(22) Filed: May 24, 2002

(65) Prior Publication Data

US 2002/0179981 A1 Dec. 5, 2002

(30) Foreign Application Priority Data

May 25, 2001 (JP) .................................... 2001-156713

(51) Int. Cl.$^7$ ............................................. H01L 29/06
(52) U.S. Cl. .............................. 257/20; 257/24; 257/27; 257/192; 257/210; 257/280; 257/281; 438/590; 455/78; 455/83
(58) Field of Search ........................... 257/20, 24, 27, 257/57, 71, 133, 138, 192, 213, 267, 270, 280, 281, 282; 438/167, 135, 570, 149, 151, 157, 166, 193, 195, 284, 385, 590; 455/78, 83, 575

(56) References Cited

U.S. PATENT DOCUMENTS

| | | | |
|---|---|---|---|
| 5,345,194 A | | 9/1994 | Nagasako ..................... 331/99 |
| 5,973,377 A | * | 10/1999 | Mizutani ..................... 257/401 |
| 6,118,985 A | * | 9/2000 | Kawakyu et al. ............. 455/78 |
| 6,166,404 A | * | 12/2000 | Imoto et al. ................. 257/279 |

OTHER PUBLICATIONS

NEC Corp., "C To X Band Amplifier C To X Band OSC N–Channel GaAs," Aug. 1994.

* cited by examiner

Primary Examiner—David Nelms
Assistant Examiner—Long Tran
(74) Attorney, Agent, or Firm—Morrison & Foerster LLP

(57) ABSTRACT

A semiconductor switching device includes two FETs with different device characteristics, a common input terminal, and two output terminals. A signal transmitting FET has a gate width of 500 $\mu$m and a signal receiving FET has a gate width of 400 $\mu$m. A resistor connecting a gate electrode and a control terminal of the signal transmitting FET is tightly configured to provide expanding space for the FET. Despite the reduced size, the switching device can allow a maximum power of 22.5 dBm to pass through because of the asymmetrical device design. The switching device operates at frequencies of 2.4 GHz or higher without use of shunt FET.

12 Claims, 8 Drawing Sheets

PRIOR ART

FIG.4A
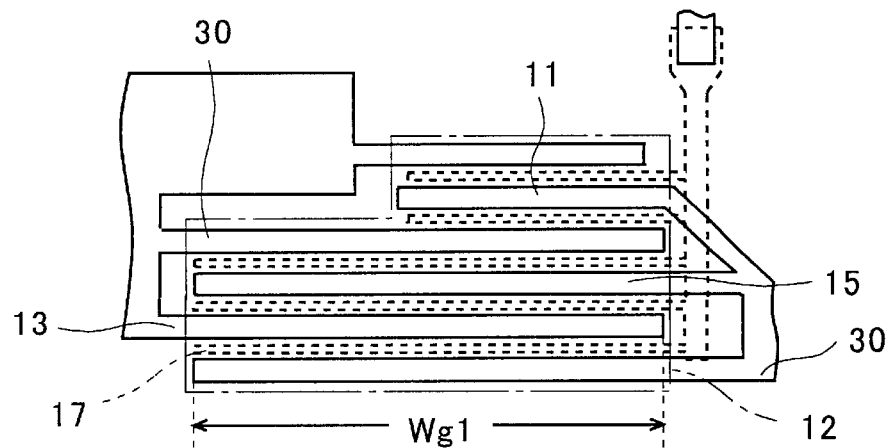
FIG.4B
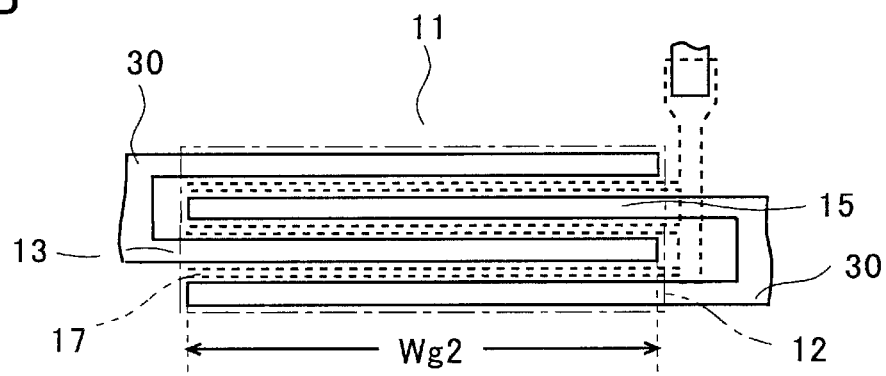
FIG.5
Pinch-off voltage = 2.2V
| Gate Width(μm) | Idss(A) | Maximum Power(dBm) |
|---|---|---|
| 100 | 0.023 | 8.94 |
| 200 | 0.05 | 14.96 |
| 300 | 0.07 | 18.48 |
| 400 | 0.09 | 20.98 |
| 500 | 0.12 | 22.91 |
| 600 | 0.14 | 24.50 |
| 800 | 0.18 | 27.00 |
| 1000 | 0.23 | 28.94 |

SEMICONDUCTOR SWITCHING DEVICE

BACKGROUND OF THE INVENTION

1. Field of the Invention

The invention relates to a semiconductor switching device for switching at high frequencies, specifically to a compound semiconductor switching device operating at frequencies equal to or higher than 2.4 GHz.

2. Description of the Related Art

Mobile communication devices such as mobile telephones often utilize microwaves in the GHz range, and commonly need switching devices for high frequency signals which are used in switching circuits for changing antennas and switching circuits for transmitting and receiving such signals. A typical example of such a switching device can be found in Japanese Laid-Open Patent Application No. Hei 9-181642. Such a device often uses a field-effect transistor (called FET hereinafter) formed on a gallium arsenide (GaAs) substrate, as this material is suitable for use at high frequencies, and developments have been made in forming a monolithic microwave integrated circuit (MMIC) by integrating the aforementioned switching circuits.

FIG. 1A is a cross-sectional view of a conventional GaAs FET. The GaAs substrate 1 is initially without doping, and has beneath its surface an n-type channel region (or a channel layer) 2 formed by doping with n-type dopants. A gate electrode 3 is placed on the surface of the channel region 2, forming a Schottky contact, and a source electrode 4 and a drain electrode 5 are placed on both sides of the gate electrode 3, forming ohmic contacts to the surface of the channel region 2. In this transistor configuration, a voltage applied to the gate electrode 3 creates a depletion layer within the channel region 2 beneath the gate electrode 3 and, thus, controls the channel current between the source electrode 4 and the drain electrode 5.

FIG. 1B shows the basic circuit configuration of a conventional compound semiconductor switching device called a SPDT (Single Pole Double Throw) switch, using GaAs FETs. The source electrode (or the drain electrode) of each FET (FET1 and FET2) is connected to a common input terminal IN. The drain electrode (or source electrode) of each FET (FET1 and FET2) is connected to respective output terminals (OUT1 and OUT2). The gates of FET1 and FET2 are connected to the control terminals Ctl-1, Ctl-2 through resistors R1, R2, respectively. A pair of complementary signals is applied to the two control terminals, Ctl-1, Ctl-2. When a high level signal is applied to the control terminal of one of the FETs, the FET changes to an on-state, and a signal fed to the common input terminal IN passes through the FET and reaches one of the output terminals OUT1, OUT2. The role of the resistors R1 and R2 is to prevent leakage of the high frequency signals through the gate electrodes to the DC voltages applied to the control terminals Ctl-1, Ctl-2, which are substantially grounded at a high frequency.

The switching device shown in FIG. 1B must have shunts, which lead leaking signals to the ground, to attain a high degree of isolation. Alternatively, the gate width may be reduced to about 600 µm without utilizing shunts so that the overall size of the switching device is reduced with a proper isolation, as described in commonly owned copending U.S. patent application Ser. No. 09/855,030, entitled "COMPOUND SEMICONDUCTOR DEVICE FOR SWITCHING." The disclosure of U.S. patent application Ser. No. 09/855,030 is, in its entirety, incorporated herein by reference.

The gate width may be further reduced to about 400 µm while the switching device is still able to allow a linear input power (power hereinafter) as high as 20 dBm to pass through, which is required for applications such as BLUETOOTH and Wireless LAN, as described in another commonly owned copending U.S. patent application Ser. No. 10/105,802, entitled "SEMICONDUCTOR SWITCHING DEVICE." The disclosure of U.S. patent application Ser. No. 10/105,802 is, in its entirety, incorporated herein by reference. This is achieved by using two FETs (FET1 and FET2) with different device characteristics including saturation current and pinch-off voltage.

However, the maximum power of 20 dBm may not be sufficient for other applications including ISM Band communications used in Wireless LAN with a high transmission rate.

SUMMARY OF THE INVENTION

The invention provides a semiconductor switching device including a first field effect transistor and a second field effect transistor. Each of the transistors includes a source electrode, a gate electrode and a drain electrode which are formed on the channel layer of the respective transistor. The first transistor has a larger gate width than the second transistor so that the first transistor has a higher saturation current than the second transistor. The switching device also includes a common input terminal connected to the source electrode or the drain electrode of the first transistor and connected to the source electrode or the drain electrode of the second transistor. A first output terminal is connected to the source electrode or the drain electrode of the first transistor which is not connected to the common input terminal. A second output terminal is connected to the source electrode or the drain electrode of the second transistor which is not connected to the common input terminal. In this configuration, the gates of the first transistor and the second transistor receive control signals so that one of the transistors opens as a switching element and the other of the transistors closes as another switching element. The gate width of the first transistor may be larger than 400 µm while the gate width of the second transistor may be equal to or smaller than 400 µm. Furthermore, the pinch-off voltage of the first transistor may be larger than the pinch-off voltage of the second transistor.

BRIEF DESCRIPTION OF THE DRAWINGS

FIGS. 4A and 4B are expanded plan views of gate portions of FET1 and FET2 shown in FIG. 3, respectively.

FIG. 5 shows the allowed maximum power of the switching device as a function of gate width and Idss.

DETAILED DESCRIPTION OF THE INVENTION

An embodiment of this invention will be described hereinafter with reference to the FIGS. 2–9.

Figure 1A:
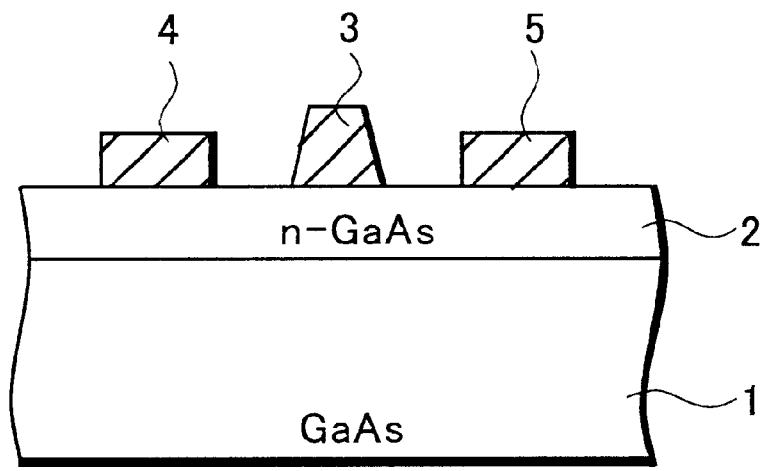
FIG. 1A is a cross-sectional view of a conventional switching device.
Figure 1B:
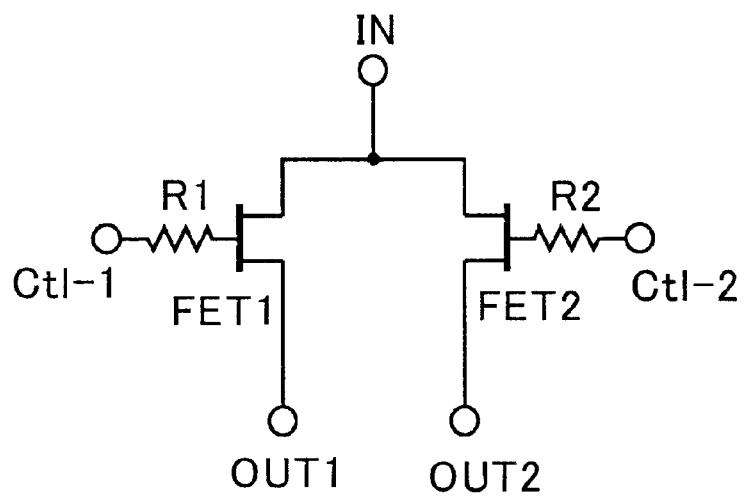
FIG. 1B is a circuit diagram of a conventional SPDT switch.
Figure 2:
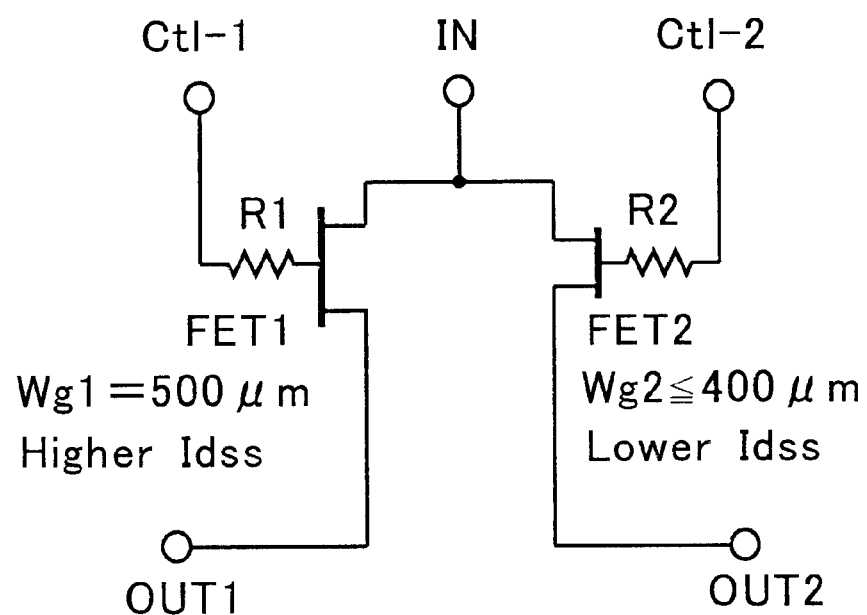
FIG. 2 is a circuit diagram of a semiconductor switching circuit device of an embodiment of this invention.

FIG. 2 is a circuit diagram of a semiconductor switching circuit device of an embodiment of this invention. The device has first and second FETs (FET1, FET2), each of which has a source electrode, a gate electrode and a drain electrode on its channel layer. The device also has a common input terminal IN connected to the source electrodes (or the drain electrodes) of the FETs (FET1, FET2), a first output terminal connected to the drain electrode (or the source electrode) of the first FET (FET1), and a second output terminal connected to the drain electrode (or the source electrode) of the second FET (FET2). The gate electrode of FET1 is connected to a control terminal Ctl-1 via resistor R1, and the gate electrode of FET2 is connected to a control terminal Ctl-2 via resistor R2. A pair of complementary signals is applied to the control terminals Ctl-1, Ctl-2 so that one of FET1 and FET2, which receives an H-level signal, turns on and connects the common input terminal and the output terminal connected to the FET, and the other of FET1 and FET2, which receives a L-level signal, remains turned off. In other words, the FET receiving the H-level signal opens as a switching element and the FET receiving the L-level signal closes as another switching element. The resistors R1, R2 prevent leakage of high frequency signals from the gate electrodes to the control terminals Ctl-1, Ctl-2.

One of the characteristics of the switching device of FIG. 2 is that the gate width Wg, which is the summation of the width of each gate in the FET structure as described later with reference to FIG. 4, is different among FET1 and FET2. The transmitting FET (FET1), which is in an on-state when the switching device is transmitting signals, has a gate width Wg1 of about 500 μm. On the other hand, the receiving FET (FET2), which is in an off-state when the switching device is transmitting signals, has a gate width Wg2 equal to or less than 400 μm. This leads to different saturation currents (the saturation current will be referred to as Idss hereinafter) among FET1 and FET2. Specifically, FET1 with Wg1 can allow higher power to pass through than FET2 with Wg2 because FET1 has a higher Idss than FET2. Idss is the electric current between a drain and a source of an FET when the current between the drain and the source becomes saturated under the application of a sufficiently high voltage between the drain and the source while keeping the source and the gate at an equal voltage.

Another characteristic of the switching device of FIG. 2 is that Idss and/or a pinch-off voltage, which is a voltage required to turn an FET off, are different among FET1 and FET2. The maximum power of this type of switching device is determined by the Idss of the FET used for transmitting signals and the pinch-off voltage of the FET used for receiving signals.

The Idss of the FET, which turns on while transmitting signals, determines the maximum power ($P_{out1}$) in dBm as follows:

$$P_{out1}=10\ \log_{10}\{[(2R \times Idss/1.3)^2 \times 1/(8R)] \times 1000\} \quad (1)$$

in which R is a load resistance, which is 50 Ω in this embodiment.

For an on-side FET, the maximum power allowed for a switching device decreases when the gate width Wg decreases because the Idss decreases accordingly, as predicted by equation 1. The term "on side" refers to an FET which turns on during a particular type of operation. In this particular instance, the on-side FET is the FET which turns on while transmitting signals. Similarly, an FET, which turns off during a particular operation, is on the off side. However, this reduction of Idss due to the reduction of the gate width Wg can be compensated for by preventing the reduction of Idss by modifying other design features of the FET. This may be accomplished by increasing the depth of the channel region or by increasing the impurity concentration of the channel layer. However, when these measures are not sufficient for obtaining an adequate Idss for a particular application, the gate width Wg may be increased.

On the off side, the FET used for receiving signals, which is turned off during signal transmission by the other FET, has to withstand the voltage required for generating the allowed maximum power of the FET used for transmitting signals while the device is transmitting signals. This can be accomplished by lowering the pinch-off voltage of the FET on the off side, as will be described later in detail. The pinch-off voltage of FET can be lowered by reducing the depth of the channel layer or the impurity concentration of the channel layer. This is achieved by adjusting conditions of ion implantation into the channel layer. In general, an FET with a higher Idss has a higher pinch-off voltage and an FET with a lower Idss has a lower pinch-off voltage.

Accordingly, the FET which has a higher Idss serves substantially as a signal transmitting path. The FET which has a lower Idss serves substantially as a signal receiving path. Thus, this circuit is asymmetrical. As long as each FET conforms to its designated role, either signal transmitting or signal receiving, this asymmetrical switching device operates efficiently.

In this embodiment, Idss of the transmitting FET (FET1) is increased by making the gate width Wg relatively large (about 500 μm, but not 400 μm) and by increasing the Idss of a unit length of the gate width Wg (i.e. controlling ion implantation into the channel layer).

The switching device of FIG. 2 has an isolation similar to a switching device in which two FETs have a gate width of about 400 μm. An isolation is defined by the power leaking through an off-side FET while the other FET, an on-side FET, is in operation, i.e. transmitting signals. For example, an isolation of 20 dB at 400 μm gate width means that one hundredth ($10^{-2}$) of the power passing through the on-side FET is leaking through the off-side FET. When the switching device of FIG. 2 is transmitting signals, the device can attain the same isolation as the switching device with two FETs of 400 μm gate width because the off-side FET in this instance (FET2) also has a gate width of 400 μm. On the other hand, when the switching device is receiving signals, the device may have smaller isolation because the off-side FET in this instance (FET2) also has a gate width of 500 μm. However, this decrease in isolation is negligible because the power passing through the on-side FET in this instance (FET2) is equal to or smaller than 0 dBm.

Figure 3:
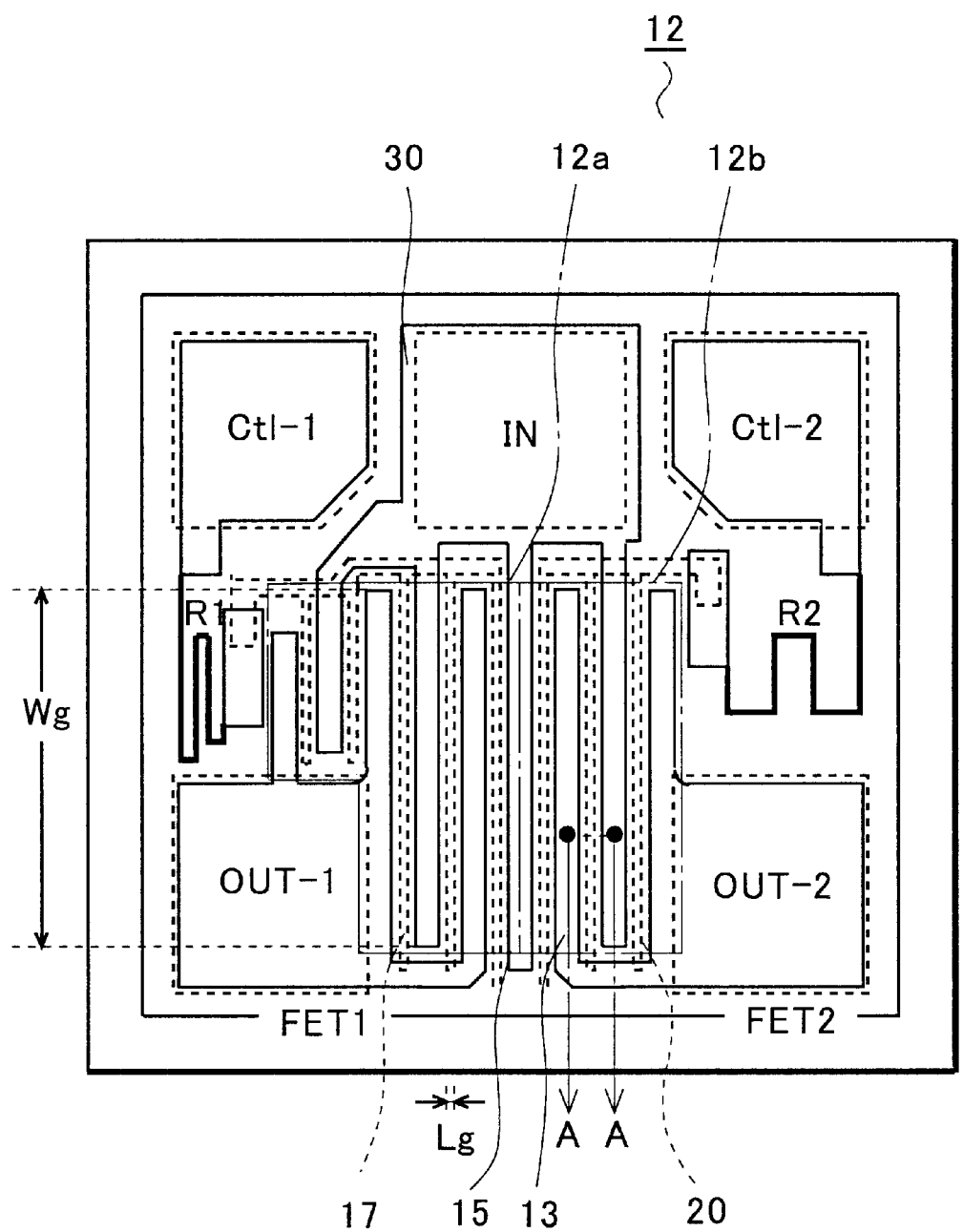
FIG. 3 is a plan view of a switching device of the embodiment of FIG. 2 integrated as a chip.

FIG. 3 is an example of a semiconductor switching device integrated as a compound semiconductor chip, based on the circuit design of FIG. 2. The two switching FETs (FET1 on the left, FET2 on the right) occupy the central portion of a GaAs substrate. Resistors R1, R2 are connected to the gates of the two respective FETs. The terminals, IN, OUT1, OUT2, Ctl-1, Ctl-2 occupy a significant area of the substrate surface as connecting pads. The dashed lines indicate a second layer of wiring which is formed in the same processing step as the gate electrodes of the FET and is made of a gate metal layer (Ti/Pt/Au) 20. A third layer of wiring indicated by the solid lines is for connecting the device elements and forming the connecting pads, and is made of a pad metal layer (Ti/Pt/Au) 30. A first layer contains an ohmic metal layer (AuGe/Ni/Au) 10 making an ohmic contact with the substrate, which forms the source electrode, the drain electrode and electrodes for the resistors. In FIG. 3, the first layer is not shown, as it overlaps with the pad metal layer.

As shown in FIG. 3, the resistor R1 is bent more tightly than the resistor R2 to create an extra space between the control terminal Ctl-1 and the output terminal OUT-1. In this configuration, however, the minimum allowable isolation between the wirings of 20 dB is assured. Portions of the gate electrode, the source electrode and the drain electrode of FET1 are placed in that extra space created by the tighter configuration of the resistor R1. The entire resistor R1 is also placed between the two terminals Ctl-1, OUT-1. Accordingly, the switching device of FIG. 3 can occupy only the same surface area as the switching device in which two FETs have a gate width of about 400 μm, even though one of the FET of the device has a gate width of about 500 μm. In other words, the chip size of this embodiment is about 0.31×0.31 mm².

FIGS. 4A and 4B show expanded plan views of FET1 and FET2, respectively. Each shows a comb-like structure including the source electrode 13, the drain electrode 15, and the gate electrode 17. In FET2 (FIG. 4B), the rectangle area 12a denoted by the unevenly broken line shows the channel layer formed on a GaAs substrate 11. The source electrode 13 (or the drain electrode) is formed of the pad metal layer (Ti/Pt/Au) 30 as the third layer extending from the left side of the drawing, has a comb-like structure having two teeth, and is connected to the output terminal OUT2. The source electrode 14 (or the drain electrode) which is formed of the ohmic metal layer (AuGe/Ni/Au) 10 as the first layer is formed underneath the source electrode 13. The drain electrode 15 (or the source electrode) is formed of the pad metal layer (Ti/Pt/Au) 30 as the third layer extending from the right side of the drawing, has a comb-like structure having two teeth, and is connected to the common input terminal IN. The drain electrode 16 (or the source electrode) which is formed of the ohmic metal layer (AuGe/Ni/Au) 10 as the first layer is formed underneath the drain electrode 15. The source electrode 13 and the drain electrode 15 are juxtaposed in an interleaved relationship to each other, and three gate electrodes 17, which are formed of the gate metal layer 20 as the second metal layer, are formed between the teeth of the combs on the channel region 12, creating another comb-like structure. In this configuration, the gate width Wg is defined as the summation of the lengths of the gate electrode 17 within the channel layer 12. In the construction of FIG. 4B, the total length of the three teeth of the gate electrode comb-like structure 17 constitutes the gate width Wg.

FET1 has the same configuration as FET2 except that FET1 has a larger gate width Wg than FET2. Each of the source electrode 13 and the drain electrode 15 has three teeth, rather than two. Five gate electrodes 17 are placed between the source electrode 13 and the drain electrode 15. The additional portions of the source electrode 13, the drain electrode 15 and the gate electrode 17 are all placed in the extra space created by tightly configuring the resistor R1. Both FET1 and FET2 have a gate length Lg of 0.5 μm.

The pinch-off voltage varies depending on the impurity concentration and the depth of the channel layer 12 of the FET, which is formed by ion implantation. The pinch-off voltage is high when the total dose of the impurity ion implanted into the channel layer 12 is high (high concentration) or the acceleration voltage for ion implantation is high (large depth). On the contrary, the pinch-off voltage is low when the total dose of the impurity ion implanted into the channel layer 12 is low (low concentration) or the acceleration voltage for ion implantation is low (small depth).

In the meantime, the Idss increases with the increase of the total dose or the acceleration voltage of the impurity ions, and decreases with the decrease of total dose or the acceleration voltage of the impurity ions. In general, a channel layer which has a high pinch-off voltage also has a high Idss. If such an FET is used as a signal transmitting FET, the allowed maximum power is high. On the other hand, a channel layer which has a low pinch-off voltage also has a low Idss. If such an FET is used as a signal receiving FET, the FET can withstand a high voltage applied to the signal receiving FET when the signal transmitting FET is transmitting signals with a maximum power.

The allowed maximum power (Pout) for the switching device is the lower of the power determined by the Idss of an on-side FET and the power determined by the pinch off voltage of an off-side FET. FIG. 5 shows the maximum power of the transmitting FET at an on-state as a function of gate width and Idss of the FET. In this embodiment, Idss is improved by increasing the impurity concentration in the channel layer and by increasing the gate width to 500 μm in comparison to the device having FETs having a gate width of about 400 μm. As shown in FIG. 5, the transmitting FET of this embodiment has an Idss of 0.12 A and a maximum power of 23 dBm when the gate width is 500 μm. As a result, the transmitting FET of this embodiment has an electric resistance of about 6.6 Ω, while the transmitting FET has an electric resistance of about 8 Ω.

Figure 6A:
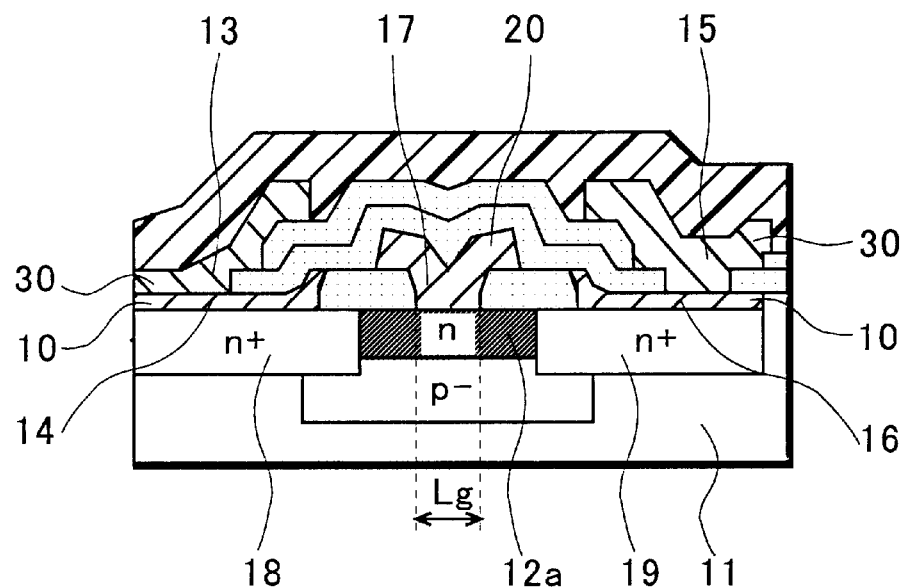
FIG. 6A is a cross-sectional view of FET1 in the embodiment of FIG. 3 showing the impurity concentration of the channel layer.
Figure 6B:
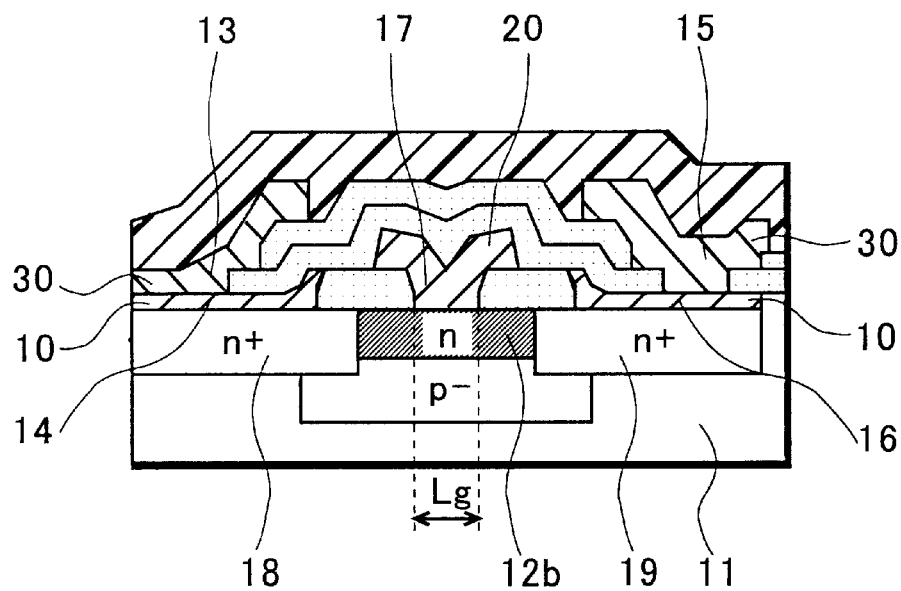
FIG. 6B is a cross-sectional view of FET2 in the embodiment of FIG. 3 showing the impurity concentration of the channel layer.

FIGS. 6A and 6B show cross-sectional views of FET1 and FET2 of this embodiment. The line on which the cross section of FIG. 6B is drawn is shown in FIG. 3 as line A—A in FET2. A corresponding portion of FET1 is also cut for the cross-sectional view. The allowed maximum power is determined by the Idss of the signal transmitting FET and the pinch-off voltage of the signal receiving FET when the signal transmitting FET is transmitting signals. In this embodiment, FET1, the signal transmitting FET, has a channel layer with a high impurity concentration to provide a high Idss, and FET2, the signal receiving FET, has a channel layer with a low impurity concentration to provide a low pinch-off voltage. Such a device construction is achieved by forming the two channel layers of the FET1 and FET2 with different total dosages (a higher dosage for FET1 and a lower dosage for FET2) but with the same ion acceleration voltage (a roughly equal depth). In addition to increase the impurity concentration, the signal transmitting FET has a larger gate width than the signal receiving FET. This increase in gate width further improves Idss.

FIG. 6A is a cross-sectional view of FET1. FET1 has an n-type channel region 12a with a high Idss formed on a GaAs substrate 11. FET1 also has the source region 18 and the drain region 19, both of which are of an n+-type high impurity region and are formed at respective ends of the channel region 12a.

The channel region 12a of FET1 (transmitting FET) has a high Idss because of a high impurity concentration in the region. Impurity ions ($^{29}Si^+$) are implanted into the area of the GaAs substrate for the channel layer formation with a total dose of $4.6\times10^{12}$ cm$^{-2}$ under an acceleration voltage of 70 KeV. The formed channel region 12a is not etched when the gate electrodes are formed. FET1 formed under the above conditions exhibits an Idss of 0.12 ampere and a maximum power of 23 dBm when the gate width is 500 μm, as already described with reference to FIG. 5. This FET1 has a pinch-off voltage of 2.2 volts.

The gate electrode 17 is formed on the channel region 12a, and the drain electrode 14 and the source electrode 16 of the first layer, both of which are made of ohmic metal layer 10, are formed on the n$^+$-type high concentration regions 18, 19. The drain electrode 13 and the source electrode 15 of the third layer, both of which are made of the pad metal layer 30, are formed on the first layer electrodes 14, 16. The pad metal layer 30 also serves as wiring lines for connecting FET elements.

FIG. 6B is a cross-sectional view of FET2. FET2 has an n-type channel region 12b with a low pinch-off voltage formed on a GaAs substrate 11. FET2 also has the source region 18 and the drain region 19, both of which are of an n+-type high impurity region and are formed at respective ends of the channel region 12b.

Impurity ions ($^{29}Si^+$) are implanted into the area of the GaAs substrate for the channel layer formation with a total dose of $3.4\times10^{12}$ cm$^{-2}$ under the same acceleration voltage of 70 KeV. The formed channel region 12b is not etched when the gate electrodes are formed. FET2 formed under above conditions has an Idss of 0.04 amperes and a pinch-off voltage of 1.1 volts when the gate width is 400 μm.

Accordingly, the production process of this switching device has two separate ion implantation steps; one for FET1 and another for FET2. The two FETs are simultaneously processed in other steps of the production process. As long as proper Idss and proper pinch-off voltages are obtained for FET1 and FET2, other ion implantation conditions, including the total dosage and the acceleration voltage, may be applied to the ion implantation step.

Figure 7A:
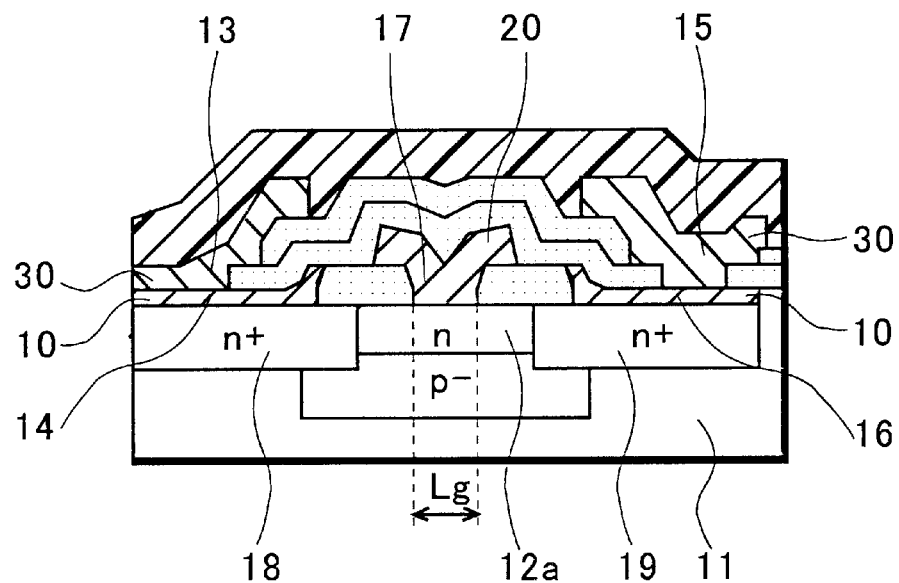
FIG. 7A is a cross-sectional view of FET1 for showing the depth of the channel layer.
Figure 7B:
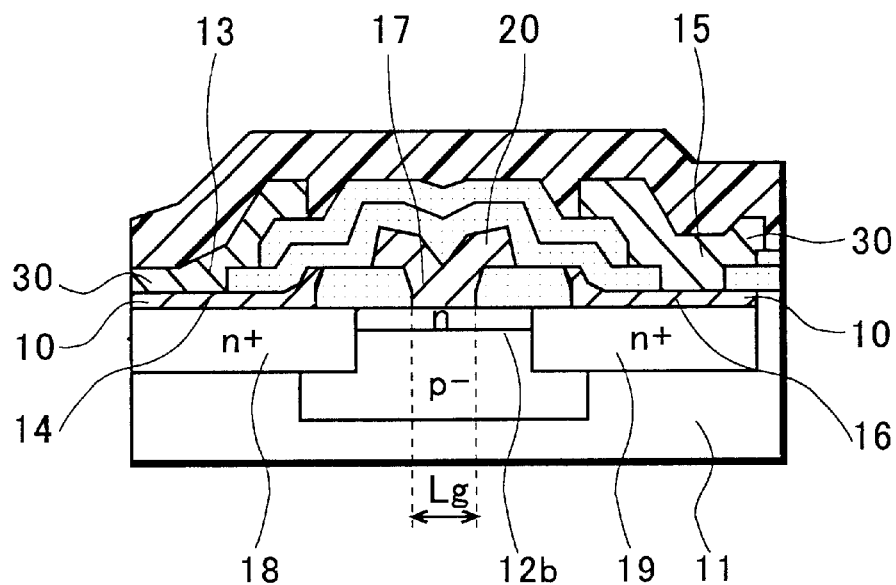
FIG. 7B is a cross-sectional view of FET2 for showing the depth of the channel layer as a modification of the device of FIGS. 6A and 6B.

Alternatively, substantially the same result is obtained by making the channel layer depth of FET1 larger than the channel layer depth of FET2, as shown in FIGS. 7A and 7B. The depth of the channel region 12a of FET1 of this modified embodiment is approximately 0.14 μm, and the depth of the channel region 12b of FET2 of this modified embodiment is approximately 0.11 μm. The channel region 12a of FET1 (transmitting FET) has a high Idss because of a large depth of the channel region 12a. The channel region 12b has a low pinch-off voltage because of a small depth of the channel region 12b. Except the construction of the channel layer, other constructions of the FET1 and FET 2 are substantially the same as the constructions of FET1 and FET2 of FIGS. 6A and 6B.

In this type of switching circuit, when the signal transmitting FET is a transmitting signal, the signal receiving FET, which is turned off during signal transmission, has to withstand the maximum power with which the signal transmitting FET is operating. Otherwise, signals being sent from the signal transmitting FET may leak through the signal receiving FET, making the maximum power allowed for the signal transmitting FET practically useless.

The maximum power allowed for the signal receiving FET ($P_{out2}$) in dBm is as follows:

$$P_{out2}=10\ \log_{10}[V\text{max}^2/(8R)\times1000] \quad (2)$$

In equation (2), R is load resistance, which is 50 Ω in this embodiment, and Vmax is a maximum voltage amplitude of applied power, which is related to the pinch-off voltage as described by the following equation:

$$V\text{max}=4\times(Vc-Vbi-Vp) \quad (3)$$

in which Vc is voltage of the control signal, Vbi is built-in voltage, and Vp is pinch-off voltage.

In this embodiment, a control signal of 3 V is applied to the control terminal Ctl-1 of the signal transmitting FET (FET1) when it is transmitting signals. Under the application of the control signal, a reverse bias of 2.6 V, which results from a subtraction of the built-in voltage, 0.4 V, of the gate Schottky contact from the control signal, 3 V, is applied to the gate Schottky contact of FET2. The reverse bias creates a depletion layer in the channel region 12b of FET2. Because the signal receiving FET (FET2) has a pinch-off voltage of 1.1 V, the channel region 12b is pinched off under an application to the gate of a reverse bias equal to or higher than 1.1 V. In this case, a surplus of 1.5 V (2.6 V-1.1 V) is generated for pinching off the channel region 12b of FET2. In other words, a voltage equal to or less than this surplus can be applied to the switching device when it is transmitting signals without losing the signals through the off-state FET. This surplus, Su, is related to Vmax as follows:

$$Su=V\text{max}/4 \quad (4)$$

In this embodiment, since Vmax is equal to 1.5×4 V and R is equal to 50 Ω, equation (2) gives an allowed maximum power of 19.5 dBm. Adding a surplus of about 3 dBm, which is experimentally shown to exist, to the calculated value, the signal receiving FET (FET2) has an allowed maximum power of about 22.5 dBm. An allowed maximum power for a switching device is determined by a smaller maximum power of the two maximum powers; i.e. the maximum power allowed for the signal transmitting FET determined by the Idss and the maximum power allowed for signal receiving FET determined by the pinch-off voltage. In this embodiment, the smaller maximum power of FET2 (22.5 dBm) provides the maximum power of the switching device.

Accordingly, the use of an asymmetrical circuit design, in which the signal transmitting FET has a higher Idss because of larger gate width and the signal receiving FET has a smaller pinch-off voltage, coupled with the tighter resistor configuration, allows size decrease and a large maximum power of the switching device. In this configuration, the Idss of the signal transmitting FET is preferably larger than the Idss of the signal receiving FET by 10% or more, and the pinch-off voltage of the signal transmitting FET is preferably larger than the pinch-off voltage of the signal receiving FET by 0.2 volt or more. Furthermore, the gate width of the transmitting FET is preferably larger than the gate width of the receiving FET by 10% or more.

The operation of the switching device of this embodiment during the signal receiving mode is described hereinafter. As described with respect to the signal transmitting mode, the allowed maximum power of an on-side FET is determined by the Idss of the FET, and the allowed maximum power of an off-side FET is determined by the pinch-off voltage of the FET. Using equation (2) and a pinch-off voltage of 2.2 V, the signal transmitting FET (FET1), which is turned off in this mode, provides a maximum power of 8.1 dBm. Using equation (1) and the Idss of 0.04 amperes, the signal receiving FET (FET2), which is turned on in this mode, provides a maximum power of 13.7 dBm. Because the smaller of the two maximum powers determines the allowed maximum power of the switching device, the switching device of this embodiment has an allowed maximum power of 8.1 dBm in the signal receiving mode. This maximum power is sufficient because the maximum power required for receiving signals is only 0 dBm.

Figure 8A:
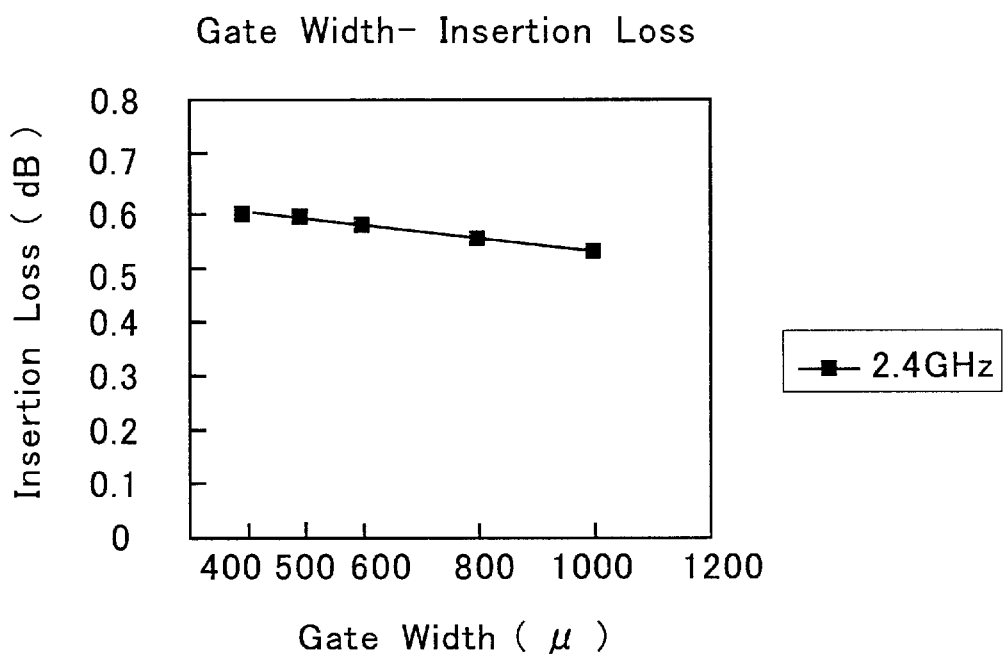
FIG. 8A shows the insertion loss of the switching device of the embodiment as a function of the gate width.
Figure 8B:
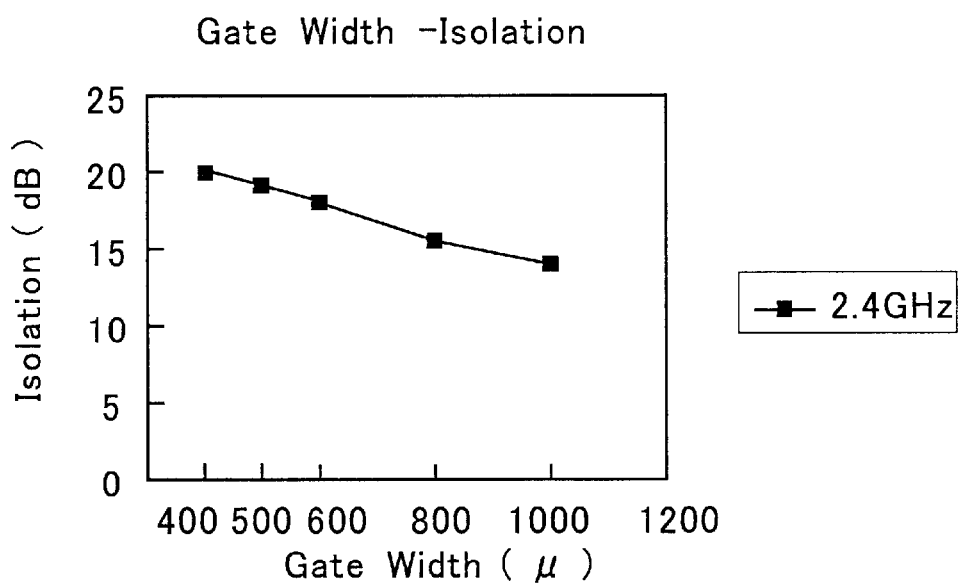
FIG. 8B shows the isolation of the switching device of the embodiment as a function of the gate width.

FIG. 8A shows the insertion loss of the switching device as a function of the gate width and FIG. 8B shows the isolation of the switching device as a function of the gate width. Both properties are measured at 2.4 GHz.

In this embodiment, the transmitting FET has a gate width of 500 μm, a gate length of 0.5 μm and a pinch-off voltage of 2.2 V and the receiving FET has a gate width of 400 μm, a gate length of 0.5 μm and a pinch-off voltage of 1.1V. According to FIG. 8A, the switching device of this embodiment has an insertion loss of 0.57 dB, which is better than the insertion loss of the device having two FETs with a gate width of 400 μm, when the switching device is transmitting signals. This is because the transmitting FET of the switching device has a gate width of 500 μm. According to FIG. 8B, the switching device has an isolation of 20 dB when the device is transmitting signals (i.e. the transmitting FET is on and the receiving FET is off), and the switching device has an isolation of 19 dB when the device is receiving signals (i.e. the transmitting FET is off and the receiving FET is on). Accordingly, in the signal transmitting mode, power leakage at the receiving FET is $10^{-2}$ of the power passing through the transmitting FET. In the signal receiving mode, however, power leakage at the transmitting FET is $10^{-1.9}$ of the power passing through the receiving FET. Although the ratio of leaking power is somewhat larger in the signal receiving mode, the absolute amount of the leaking power is negligible because the power passing through the receiving FET is small (i.e. equal to or smaller than 0 dB).

Other improvements have been made with respect to the circuit characteristics of the switching device of this embodiment. The first is that VSWR (Voltage Standing-Wave Ratio) of this embodiment is 1.1 to 1.2. VSWR is a measure of the reflection of the high frequency signals from a switching portion of a device. Specifically, VSWR is the ratio between the maximum and the minimum of a voltage standing wave which is generated by an incoming wave and a reflecting wave at a discontinuous portion of a transmission line of high frequency signal. In an ideal condition without any reflection, VSWR is equal to 1. The VSWR value of a switching device with shunts is about 1.4. The improvement of VSWR is possible because the switching device of this embodiment has only two switching FETs along the transmission line of the high frequency signal. The smaller size of the FETs also contributes to the reduction of the reflection.

Figure 9:
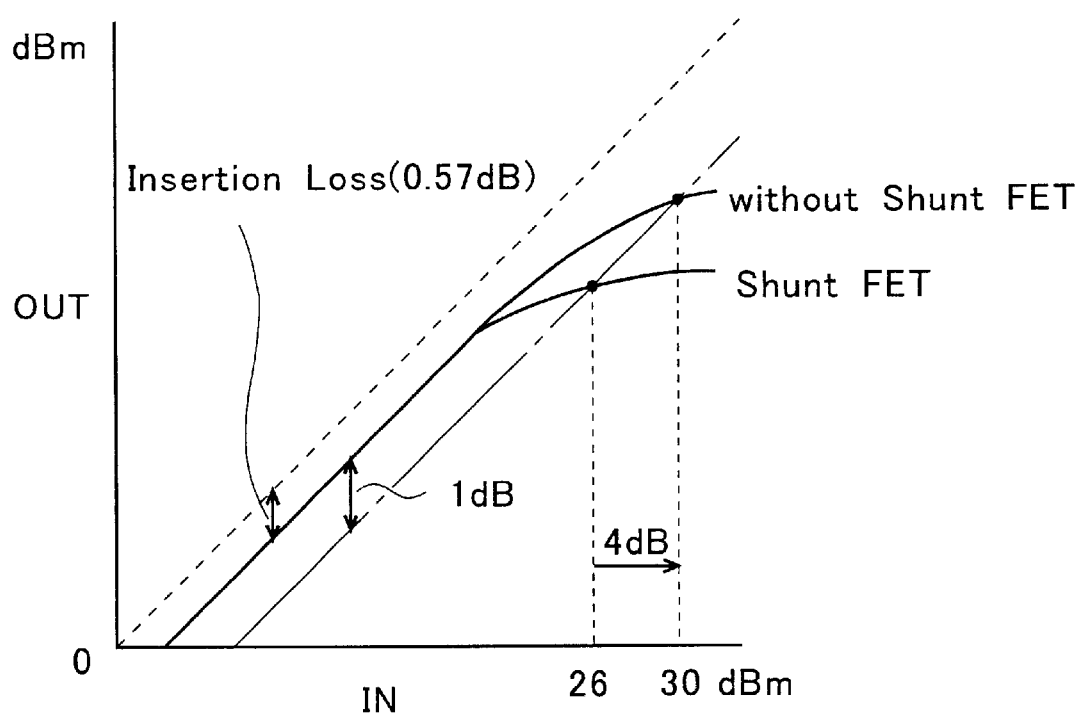
FIG. 9 shows a comparison of the dependency of output power on input power between the switching device of the embodiment of FIG. 3 and a prior art switching device with a shunt structure.

The second improvement is that the $P_{IN}1$ dB of signal transmitting FET of the device of this embodiment is 30 dBm. $P_{IN}1$ dB is a measure of the linearity between the input high frequency signal and the output signal, which is shown in FIG. 9. In the ideal case, the ratio between the input and output power is the insertion loss (0.57 dB) in the linearity region. However, in actual cases, the output power decreases due to the limited maximum allowed power. Since the output power deviates from the linearity with the increase of the input power, $P_{IN}1$ dB is defined as the point where the output power is smaller than the input power by 1 dB plus the insertion loss in the linearity region. While the $P_{IN}1$ dB is 26 dBm for a switching device with shunt FETs, the value is 30 dBm for the switching device of this embodiment. Although the $P_{IN}1$ dB of the signal receiving FET is lower than 30 dBm, this does not create any problems because the power for transmitting signals is less than 0 dBm.

As described above, the switching device of this embodiment has the following advantages. First, overall chip size is as small as 0.31×0.31 mm². Accordingly, the device can be housed in a SMCP6 package (1.6×1.6×0.75 mm³). This is achieved by removing the shunts from the switching device and reducing the gate width of the two FETs to 400 μm and 500 μm, respectively. The resistor connecting the gate electrode and the control terminal of the signal transmitting FET is tightly configured to provide expanding space for the FET. Second, despite the reduced size, the switching device can allow a maximum power of 22.5 dBm to pass through because of the asymmetrical device design. Third, the switching device can be used as an RF switch in the field of Spread Spectrum Communication using 2.4 GHz ISM Band (Industrial Scientific and Medical frequency Band).

The above is a detailed description of a particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A semiconductor switching device comprising:
    a first field effect transistor and a second field effect transistor each comprising a source electrode, a gate electrode and a drain electrode which are formed on a channel layer of the respective transistor, the first transistor having a larger gate width than the second transistor so that the first transistor has a higher saturation current than the second transistor;
    a common input terminal connected to the source electrode or the drain electrode of the first transistor and connected to the source electrode or the drain electrode of the second transistor;
    a first output terminal connected to the source electrode or the drain electrode of the first transistor which is not connected to the common input terminal; and
    a second output terminal connected to the source electrode or the drain electrode of the second transistor which is not connected to the common input terminal,
    wherein the gates of the first transistor and the second transistor receive control signals so that one of the transistors opens as a switching element and the other of the transistors closes as another switching element.

2. A semiconductor switching device comprising:
    a first field effect transistor and a second field effect transistor each comprising a source electrode, a gate electrode and a drain electrode which are formed on a channel layer of the respective transistor, a gate width of the first transistor being larger than 400 μm and a gate width of the second transistor being equal to or less than 400 μm so that the first transistor has a higher saturation current than the second transistor;
    a common input terminal connected to the source electrode or the drain electrode of the first transistor and connected to the source electrode or the drain electrode of the second transistor;
    a first output terminal connected to the source electrode or the drain electrode of the first transistor which is not connected to the common input terminal; and
    a second output terminal connected to the source electrode or the drain electrode of the second transistor which is not connected to the common input terminal,
    wherein the gates of the first transistor and the second transistor receive control signals so that one of the transistors opens as a switching element and the other of the transistors closes as another switching element.

3. The semiconductor switching device of claims 1 or 2, wherein the gate electrodes of the first transistor and the second transistor form Schottky contacts with the channel layer and the source and drain electrodes of the first transistor and the second transistor form ohmic contacts with the channel layer.

4. A semiconductor switching device comprising:
a first field effect transistor and a second field effect transistor each comprising a source electrode, a gate electrode and a drain electrode which are formed on a channel layer of the respective transistor, a gate width of the first transistor being larger than 400 μm and a gate width of the second transistor being equal to or less than 400 μm so that the first transistor has a higher saturation current than the second transistor, the gate electrodes of the first transistor and the second transistor forming Schottky contacts with the channel layer, the source and drain electrodes of the first transistor and the second transistor forming ohmic contacts with the channel layer;
a common input terminal connected to the source electrode or the drain electrode of the first transistor and connected to the source electrode or the drain electrode of the second transistor;
a first output terminal connected to the source electrode or the drain electrode of the first transistor which is not connected to the common input terminal; and
a second output terminal connected to the source electrode or the drain electrode of the second transistor which is not connected to the common input terminal, wherein
the gates of the first transistor and the second transistor receive control signals so that one of the transistors opens as a switching element and the other of the transistors closes as another switching element, and
a pinch-off voltage of the first transistor is larger than a pinch-off voltage of the second transistor.

5. The semiconductor switching device of claim 4, wherein an impurity region of the channel layer of the first transistor and the gate width of the first transistor are adjusted so that the saturation current of the first transistor is sufficient to provide a predetermined maximum power.

6. The semiconductor switching device of claim 4, wherein the pinch-off voltage of the second transistor is equal to or lower than a voltage obtained by subtracting a built-in voltage of a gate Schottky contact of the second transistor and a voltage applied to the gate Schottky contact of the second transistor corresponding to a predetermined maximum power from a control voltage applied to the gate electrode of the second transistor.

7. The semiconductor switching device of claims 1, 2 or 4, wherein the first transistor serves as a signal transmitting transistor and the second transistor serves as a signal receiving transistor.

8. The semiconductor switching device of claims 1, 2 or 4, further comprising a control terminal for the first transistor and a connection element connecting the control terminal and the gate electrode of the first transistor, wherein
the entire connection element and a part of the first transistor are disposed between the control terminal and the first output terminal.

9. The semiconductor switching device of claims 1, 2 or 4, wherein the first transistor passes through a maximum power of at least 22 dBm.

10. The semiconductor switching device of claims 1, 2 or 4, wherein the channel layer of the first transistor has a higher impurity concentration than the channel layer of the second transistor.

11. The semiconductor switching device of claims 1, 2 or 4, wherein the channel layer of the first transistor has a deeper impurity concentration region than the channel layer of the second transistor.

12. The semiconductor switching device of claims 1, 2 or 4, further comprising a semi-insulating GaAs substrate on which the channel layers are formed.

* * * * *